United States Patent [19]

Pavie

[11] Patent Number: 4,882,655
[45] Date of Patent: Nov. 21, 1989

[54] DEVICE FOR LOCKING AN ELECTRONIC EQUIPMENT HOUSING ON A TRAY

[75] Inventor: Denis Pavie, Ballancourt Sur Essonne, France

[73] Assignee: Societe Anonyme dite: VIBRACHOC, Evry Cedex, France

[21] Appl. No.: 183,960

[22] Filed: Apr. 20, 1988

[30] Foreign Application Priority Data

Apr. 22, 1987 [FR] France .................................. 87 05672

[51] Int. Cl.$^4$ .............................................. H05K 7/16
[52] U.S. Cl. .................................... 361/391; 74/89.15;
292/115; 361/380; 361/395; 361/399; 439/372
[58] Field of Search .......... 29/747; 74/89.15, 424.8 R;
211/41; 292/64, 105, 110, 115, DIG. 4, DIG.
49; 361/331, 339, 380, 391, 395, 399, 415;
439/152, 160, 299, 310, 341, 372

[56] References Cited

U.S. PATENT DOCUMENTS

| | | | |
|---|---|---|---|
| 3,796,985 | 3/1974 | Weber | 439/372 |
| 3,872,734 | 3/1975 | Riethmeier | 74/89.15 |
| 4,197,572 | 4/1980 | Aimar | 439/160 |
| 4,497,528 | 2/1985 | Murtland | 439/160 |
| 4,506,439 | 3/1985 | Roake | 29/747 |

FOREIGN PATENT DOCUMENTS

| | | | |
|---|---|---|---|
| 0071559 | 2/1983 | European Pat. Off. | |
| 548736 | 7/1956 | France | 292/DIG. 4 |
| 2229611 | 12/1974 | France | |
| 2118782 | 11/1983 | United Kingdom | 361/391 |

*Primary Examiner*—A. D. Pellinen
*Assistant Examiner*—Gregory D. Thompson
*Attorney, Agent, or Firm*—Sughrue, Mion, Zinn, Macpeak & Seas

[57] ABSTRACT

A device for locking an electronic equipment housing (1) on a tray (11). The device for a moving carriage (20) connected to the front wall (2) of the housing (1). A threaded shaft (21) along which the carriage moves has a hinge pin (22) fixed perpendicularly to one of the ends thereof. A fork (17) is disposed beneath the tray and provided with two inclined slots (30) in which the hinge pin (22) is displaced. Each slot (30) includes at least one stop notch (31, 32, 33) at one or other of its ends for holding fast the hinge pin (22) of the threaded shaft (21).

7 Claims, 2 Drawing Sheets

DEVICE FOR LOCKING AN ELECTRONIC EQUIPMENT HOUSING ON A TRAY

The present invention relates to a device locking an electronic equipment housing on a tray, the device comprising a moving carriage connected to the front face of the housing, a threaded shaft along which the carriage moves, a hinge pin fixed perpendicularly to one of the ends of the threaded shaft, and a fork disposed beneath the tray and provided with two inclined slots in which the hinge pin is displaced.

BACKGROUND OF THE INVENTION

Such electronic equipment housings are placed on fixed trays which are permanently mounted in a vehicle, for example in the cockpit of an aircraft. At the rear thereof, they include the female portion of a connector comprising a multiplicity of pins of small diameter which are therefore relatively fragile and which engage in the male portion of the connector which is permanently fixed to the rear of the tray.

Maintenance of such vehicles requires such housings to be replaced frequently, and installing or removing such housings can damage the pins of the connector.

French patent specification No. 2 229 611 describes a locking device having a central shaft fitted at one end with a hinge pin that moves in an inclined slot between two extreme positions, one of which enables the housing to be put into place (thus connecting the connector) at an acute angle providing a vertical component which presses the housing against the bottom of the tray, and the other of which is used for removing the housing, i.e. for extracting the connector parallel to the bottom of the tray.

When the hinge pin presses against one or other end of the slot, the pin is not properly held fast and as a result the housing may lift, thereby damaging the pins of the rear connector.

The object of the present invention is to hold the hinge pin firmly in place whenever the housing is being installed or removed.

SUMMARY OF THE INVENTION

To this end, each slot in the locking device of the present invention includes at least one stop notch at one or other of its ends for holding fast the hinge pin of the threaded shaft.

Preferably, the top end of each slot includes two notches for holding the hinge pin fast, with the shaft then being firmly held in a horizontal position while the housing is being installed or removed, with the bottom end of the slot also having a notch which holds the hinge pin fast so that the shaft is then held fast in a sloping position, thereby permanently pressing the housing against the bottom of the tray.

Naturally, each slot may have more than one or two stop notches.

BRIEF DESCRIPTION OF THE DRAWINGS

An embodiment of the invention is described by way of example with reference to the accompanying drawings, in which.

MORE DETAILED DESCRIPTION

Figure 1:
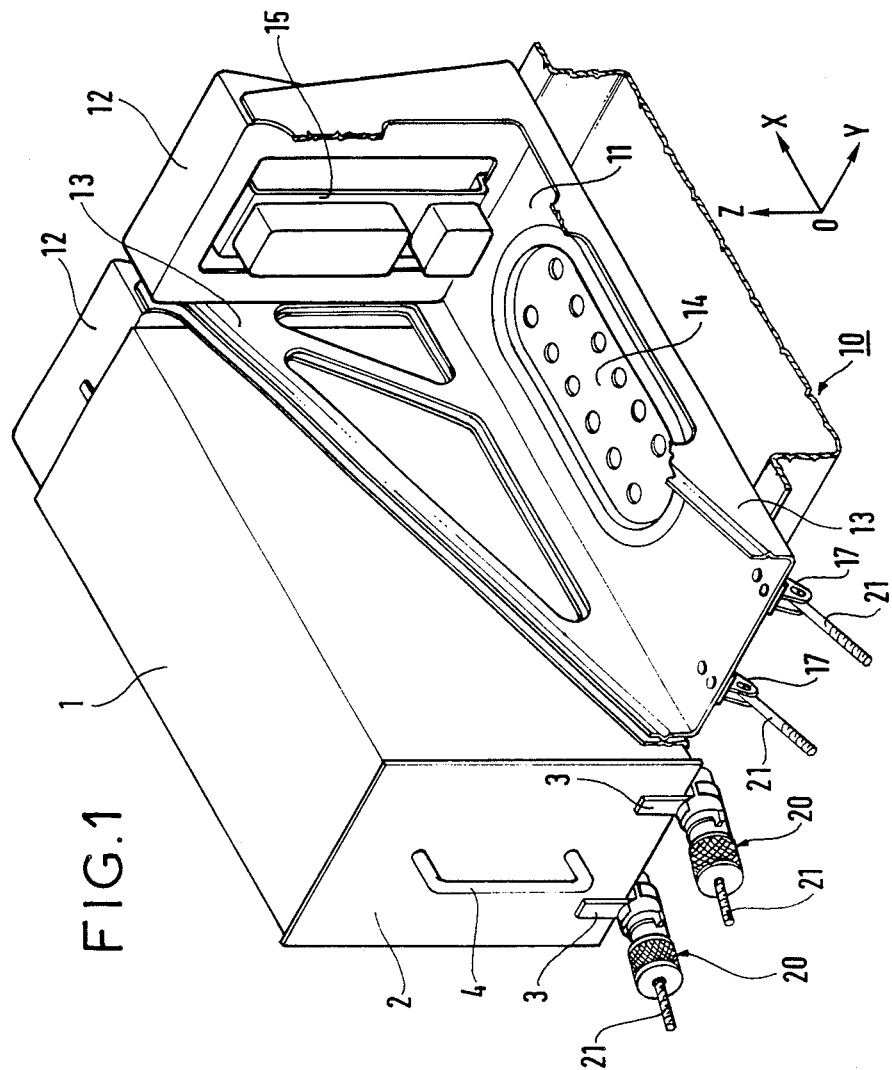
FIG. 1 is a perspective view of two trays, one fitted with a housing and the other without, each tray being provided with two locking devices.

FIG. 1 shows two trays positioned on a support 10, one provided with a housing and the other without a housing, thus clearly showing the constitution of a tray which comprises a bottom 11 provided with a diaphragm 14 enabling the housing to be ventilated, a rear plate 12 on which the male portion 15 of a connector is mounted, and finally two side flanks 13 which are in the form of open triangles limiting housing 1 movement in the direction OY, FIG. 1.

In front of the tray and beneath it there are two forks 17 each having the shaft 21 of a locking device 20 hinged thereto. The device is mechanically connected to a lug 3 on the front wall 2 of the housing 1. While the housing is being installed the lug serves to hold and extract the housing, with housing installation and extraction taking place over a very short distance which corresponds substantially to the depth of the rear connector. Prior to installation or after being extracted, the housing is grasped by means of a handle 4 fixed to its front wall 2.

Figure 2:
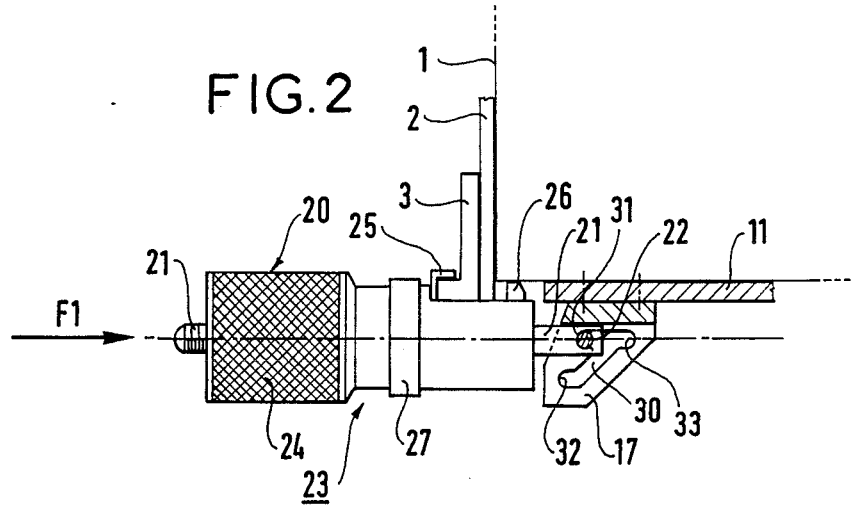
FIG. 2 shows the position of a locking device while the housing is being installed.

FIG. 2 is a side view showing a locking device 20 comprising, in conventional manner, a longitudinal shaft 21 and a carriage 23 which is movable along the shaft 21 by screwing.

The carriage 23 includes a knurled knob 24 for screwing or unscrewing purposes, i.e. for moving the carriage, a fixed hooking device 25 for hooking the locking device on the lug 3 of the housing, and a rear cleat 26 which is retractable by means of a ring 27 and which bears against the rear of front wall 2 of the housing (see FIG. 3) while the housing is being retracted.

Naturally, the locking device could include, inversely, a retractable hooking device and a fixed rear cleat.

Figure 3:
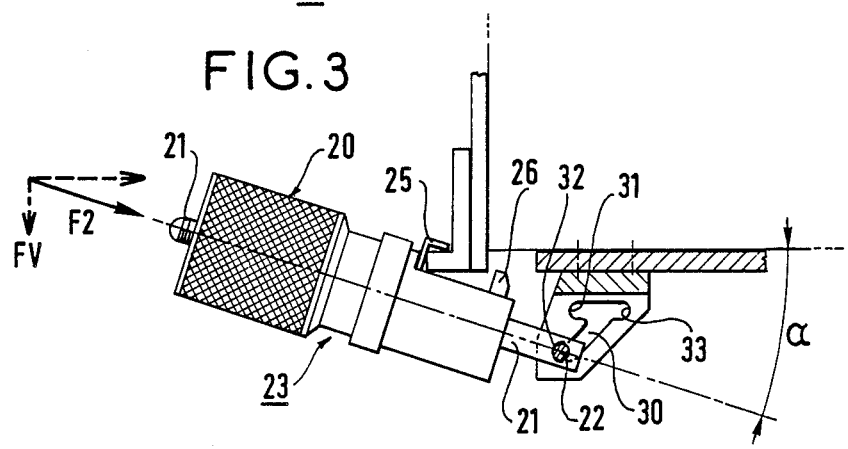
FIG. 3 shows the position of a locking device for holding the housing after it has been plugged into place.
Figure 4:
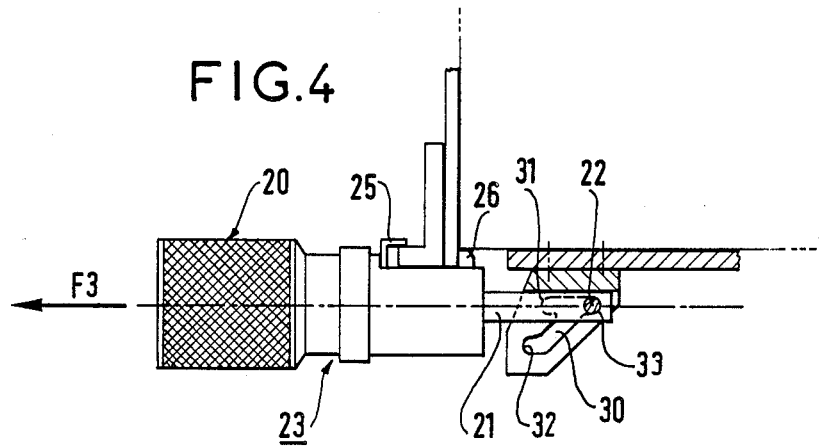
FIG. 4 shows the position of the locking device while extracting the housing.

FIGS. 2, 3, and 4 show the special shape of the vertical fork 17 which is fixed beneath the bottom 11 of the tray 10 and which is provided with two tines, each having a forwardly and downwardly sloping slot 30 terminated at its top end by two horizontal stop notches 31 and 33 and at its bottom end by one horizontal stop notch 32.

Extending perpendicularly to the end of the shaft 21 there is a hinge pin 22 which is guided between the two tines of the fork 17 and which moves in both of the slots 30, and depending on circumstances bears against one or other of the stop notches 31, 32, and 33.

FIG. 2 shows the situation when a housing is being installed. The hinge pin bears, in the direction OX, FIG. 1 against the rear stop notch 31 and when the knurled knob 24 is screwed, the housing is displaced in the direction of arrow F1.

FIG. 3 shows the situation where the housing is being held in position after it has been plugged. The hinge pin 22 bears against the stop notch 32 and the latch is thus inclined at an angle alpha, thereby giving rise to a vertical force component FV of force F2 which prevents the housing being raised in the direction OZ, FIG. 1 once it has been installed in a vehicle which is in service.

FIG. 4 shows how the housing is removed. The hinge pin 22 bears against stop notch 33, the cleat 26 bears against the back of the front wall of the housing, and unscrewing the knurled knob 24 thus causes the housing to be displaced along arrow F3.

A housing is installed as follows:

The operator holds the housing by its handle 4, places the housing on the tray, and pushes until the female portion of the connector comes into contact with the male portion 15. The operator then connects each of the locking devices on the corresponding lug 3 and screws the knurled knobs to cause the housing to move along axis OX until the connector is properly plugged. The operator then unscrews the knurled knobs, inclines the locking devices to bring their respective hinge pins into the notches 32 and then tightens the knurled knobs in order to lock the housing in place. The housing is now installed.

A housing is removed as follows:

The operator loosens the knurled knobs, straightens up the locking devices, puts the cleats 26 into place by rotating the rings 27, and then brings each of the hinge pins into the notches 33.

Thereafter, the knurled knobs are unscrewed with the housing moving opposite to direction OX, FIG. 1, until the rear connector has disconnected, whereupon the housing 1 may be grasped by means of its handle 4 and lifted from the tray 11.

I claim:

1. A device for locking an electronic equipment housing having a vertical front wall on a tray, said device comprising a moving carriage adapted to be connected to the front wall of the housing, a threaded shaft along which the carriage moves, a hinge pin fixed perpendicularly to one of the ends of the threaded shaft, and a fork disposed beneath the tray and provided with two parallel inclined slots which extend downwardly and forwardly towards said front wall, in which the hinge pin is displaced, wherein each slot includes at least one stop notch at at least one end thereof projecting at an angle to said slot and holding fast the hinge pin of the threaded shaft.

2. A locking device according to claim 1, wherein each said slot has a top end and a bottom end and wherein said at least one notch is at the top end of each slot and extends forwardly toward said front wall holding the hinge pin fast, with the shaft held fast in a horizontal position while the housing is being installed.

3. A locking device according to claim 1, wherein each said slot has a top end and a bottom end and said at least one notch is at the top end of each slot and extends horizontally rearwardly away from said front wall and holds the hinge pin fast, with the shaft held fast in a horizontal position while the housing is being removed.

4. A locking device according to claim 1, wherein each said slot has a top end and a bottom end and said at least one notch is a bottom end stop notch extending horizontally, towards said front wall and holding the hinge pin fast, with the shaft in an inclined position permanently pressing the housing against the bottom of the tray.

5. A locking device according to claim 2, wherein said top end of each said slot includes an additional stop notch which extends horizontally rearwardly away from said front wall and holding the hinged pin fast, with the shaft held fast in a horizontal position while the housing is being removed.

6. A locking device according to claim 5, wherein each of said slots includes a further stop notch at said bottom end extending horizontally towards said front wall and holding the hinge pin fast, with the shaft in an inclined position permanently pressing the housing against the bottom of the tray.

7. A device for locking an electronic equipment housing having a vertical front wall on a horizontal tray, said device comprising a moving carriage adapted to be connected to the front wall of the housing, a threaded shaft along which the carriage moves, a hinged pin fixed perpendicularly to one of the ends of the threaded shaft, and a fork disposed beneath the tray and provided with two parallel inclined slots which extend downwardly and forwardly towards said front wall in which the hinged pin is displaced, and wherein each said slot has a top end and a bottom end, the improvement comprising first and second horizontal, parallel stop notches at said top end extending respectively forwardly toward said front wall and rearwardly away from said front wall, and wherein said slots at said bottom end includes a third horizontal stop notch extending horizontally toward said front wall, such that with said hinged pin fast within said first stop notch, the shaft is held fast in a horizontal position during housing installation, with said hinged pin fast within said second stop notch, said shaft is held fast in a horizontal position while the housing is being removed, and with the hinged pin fast within said third stop notch the shaft is in an inclined position permanently pressing the housing against the bottom of the tray.

* * * * *